US005831867A

United States Patent [19]
Aji et al.

[11] Patent Number: 5,831,867
[45] Date of Patent: Nov. 3, 1998

[54] METHOD AND SYSTEM FOR AUTOMATED ELECTROMIGRATION VERIFICATION IN ACCORDANCE WITH FABRICATION PROCESS RULES

[75] Inventors: Sandeep A. Aji, San Francisco; Meera Kasinathan, Sunnyvale, both of Calif.

[73] Assignee: Sun Microsystems, Inc., Palo Alto, Calif.

[21] Appl. No.: 669,627

[22] Filed: Jun. 24, 1996

[51] Int. Cl.[6] ................................................. G06F 17/00
[52] U.S. Cl. ..................... 364/489; 364/488; 364/490; 364/491
[58] Field of Search .................. 364/488–491, 364/578; 395/500

[56] References Cited

U.S. PATENT DOCUMENTS

| 5,410,490 | 4/1995 | Yastrow | 364/488 |
| 5,581,475 | 12/1996 | Majors | 364/491 |
| 5,598,348 | 1/1997 | Rusu et al. | 364/491 |

OTHER PUBLICATIONS

Yi et al. "Electromigration–Induced Integration Limits on the Future ULSI's and the Beneficial Effects of Lower Operation Temperatures," IEEE, pp. 683–688, Apr. 1995.
Ghandhi, Sorab K., "VLSI Fabrication Principles–Silicon and Gallium Arsenide", 2nd Edition, John Wiley & Sons, Inc., 1994, pp. 526–527.
"PowerMill Product Brief", EPIC Design Technology, Inc., Dec. 16, 1994.

*Primary Examiner*—Emanuel Todd Voeltz
*Assistant Examiner*—Vuthe Siek
*Attorney, Agent, or Firm*—Beyer & Weaver, LLP

[57] ABSTRACT

An automated method and system for detecting electromigration violations in signal lines of an integrated circuit design to be fabricated is disclosed. The automated method and system checks conductive traces, vias and/or contacts that are used to route signals to and from various functional cells within the integrated circuit design against predetermined process rules to detect electromigration violations. The operation and effectiveness of the automated method and system are far superior to conventional manual approaches.

20 Claims, 8 Drawing Sheets

METHOD AND SYSTEM FOR AUTOMATED ELECTROMIGRATION VERIFICATION IN ACCORDANCE WITH FABRICATION PROCESS RULES

BACKGROUND OF THE INVENTION

1. Field of the Invention

The present invention relates to design and fabrication of integrated circuits and, more particularly, to electromigration verification.

2. Description of the Related Art

Electromigration refers to the transport of mass in metals when stressed to high current densities. Electromigration occurs during passage of currents through thin metal conductors in integrated circuits. These thin metal conductors normally have sub-micron widths. Hence, metal piles up in some regions of the thin metal conductors and forms voids in other regions. The formation of voids in the thin metal conductors is very serious because such voids cause opens in the metal conductors which in turn cause the integrated circuit to fail. The pilling up or accumulation of metal in the thin metal conductors can cause shorts between adjacent metal conductors which can also lead to circuit failure.

Electromigration sets a fundamental limit on the dimensions of conductors which carry current. The fundamental limit depends strongly on the choice of conductive material and its particular properties. Thus, the dimensions (e.g., width and height of the conductors) must be of a certain size to prevent, or at least minimize, failures due to electromigration for a particular fabrication process.

Conventionally, when preparing to fabricate an integrated circuit, process rules for a fabrication setup are used to specify the minimal dimensions and spacing that the conductors should have for the fabrication processing. The process rules are minimum values that are allowable to ensure proper fabrication of the integrated circuit. With respect to electromigration, the process rules pertain to dimensions or sizes of wires, contacts or other conductive features of the integrated circuit for different expected currents. If the circuit design satisfies the pertinent process rules, then failures due to electromigration are avoided or at least minimized. Hence, before fabricating an integrated circuit, it is important to check that the circuit design does not violate the pertinent process rules. Although such checks could be done manually, manual checking is not practical because it is tedious, time consuming and susceptible to error.

The conductors of the circuit design can carry either power or signals within the integrated circuit. Power lines tend to be in known locations with known current loads because a detailed analysis is usually performed when forming the power network. In contrast, signal lines tend to be plentiful and have complex routing and varying locations throughout the integrated circuit. Therefore, the checking of a circuit design for electromigration violations in signal lines is substantially more complex than for power lines. Here, even if manual checking were to be done on the signal lines (though it is often not), the checking would be incomplete, susceptible to error, and otherwise unacceptable. If manual checking fails to find one or more electromigration violations, the integrated circuits being fabricated would still fail and would have to be discarded or undergo revisions to the metal layers, both of which are costly.

At least one automated tool exists for checking power lines of an integrated circuit design against process rules for electromigration violations. PowerMill™ by Epic Design Technology, Inc. of Santa Clara, Calif. is such a product. However, since power lines tend to be in known locations with known current loads, the checking with respect to power lines can be accomplished. Nevertheless, the automated tool is unable to check signal lines against process rules for electromigration violations.

Thus, there is a need for an automated technique that is able to determine whether electromigration limits for a fabrication process are violated by signal lines within an integrated circuit design.

SUMMARY OF THE INVENTION

According to the principals of the invention, an automated method and system detects electromigration violations in signal lines of an integrated circuit design prior to fabrication. The automated method and system of the invention checks conductive traces (e.g., wires or links), vias and/or contacts that are used to route signals to and from various functional cells within the integrated circuit design against predetermined process rules to detect electromigration violations. The automated method and system according to the invention are able to find all electromigration violations and thus provides complete coverage which is far superior to conventional manual approaches.

The invention can be implemented in numerous ways, including as a method and a system. Several embodiments of the invention are mentioned below.

As a computer implemented method for detecting electromigration violations in an integrated circuit design, the integrated circuit design having driving nodes and one or more networks, the driving nodes being coupled to the one or more networks, and each of the networks including conductive traces, an embodiment of the invention includes the operations of: providing electromigration process rules for conductive signal traces of the integrated circuit design; identifying the driving nodes within the integrated circuit design; determining a drive strength for each of the driving nodes; determining a capacitance for each of the networks coupled to the driving nodes; determining design dimensions of conductive signal traces within the networks of the integrated circuit design; determining minimum dimensions for the conductive signal traces of the integrated circuit design based on the determined capacitance, the determined drive strength and the electromigration process rules; comparing the determined design dimensions with the minimum dimensions; and identifying violations of the fabrication process rules for the conductive signal traces of the integrated circuit design when the comparing indicates that the determined dimensions are less than the minimum dimensions. Additionally, the embodiment may also include the operation of forming an output error file that includes information concerning the violations identified.

As a computer-implemented method for checking an integrated circuit design for violations of fabrication process rules, an embodiment of the invention includes the operations of: partitioning the integrated circuit design into nets that couple functional cells together, each net having wires and contacts; determining a drive strength that drives each of the nets; determining a capacitance for each of the nets; determining a minimum wire width for each of the nets based on the determined capacitance and the determined drive strength that are respectively associated therewith; and identifying violations of the fabrication process rules when the width of the wires within the nets are less than the minimum wire width for the respective net. Additionally, the embodiment may also include the operation of forming an output error file that includes information concerning the violations identified. Further, the embodiment may include the operations of: determining a minimum contact size for each of the nets based on the determined capacitance and the determined drive strength, and identifying violations of the fabrication process rules when the size of the contacts within the nets are less than the minimum contact size for the respective net.

As a computer-implemented method for checking an integrated circuit design for violations of fabrication process rules, another embodiment of the invention includes the operations of: partitioning the integrated circuit design into nets that couple functional cells together, each net having wires and contacts; determining a drive strength for each of the nets; determining a capacitance for a plurality of wires and contacts within each of the nets; determining minimum dimensions for the wires and contacts within each of the nets based on the determined drive strength and the determined capacitances for the wires and contacts; and automatically identifying violations of the fabrication process rules when the dimensions of the wires and contacts within the net are less than the minimum wire width. Additionally, the embodiment may also include the operation of forming an output error file that includes information concerning the locations of the violations within the integrated circuit design.

As an electromigration check system for automated identification of electromigration errors in an integrated circuit design, the integrated circuit design including at least one network and at least one functional cell, an embodiment of the invention includes: a layout file containing layout information for the integrated circuit design; a capacitance file for storing one or more capacitance values for at least one network or a portion thereof within the integrated circuit design; a library file for storing functional cells and parameters for the functional cells; a rules table containing process rules for fabrication of integrated circuits; and a processing unit for identifying electromigration errors in the integrated circuit design.

Other aspects and advantages of the invention will become apparent from the following detailed description in conjunction with the accompanying drawings, which illustrate by way of example the principles of the invention.

BRIEF DESCRIPTION OF THE DRAWINGS

The present invention will be readily understood by the following detailed description in conjunction with the accompanying drawings, in which.

DETAILED DESCRIPTION OF THE INVENTION

The invention pertains to an automated method and system for detecting electromigration violations in signal lines of an integrated circuit design. The automated method and system checks conductive traces (e.g., wires), vias and/or contacts that are used to route signals to and from various functional cells within the integrated circuit design against predetermined process rules to detect electromigration violations. If electromigration violations are detected, then the integrated circuit design may be modified to remove the electromigration violations before integrated circuits incorporating the integrated circuit design are fabricated.

Embodiments of the invention are discussed below with reference to FIGS. 1–5C. However, those skilled in the art will readily appreciate that the detailed description given herein with respect to these figures is for illustrative purposes as the invention extends beyond these limited embodiments.

Figure 1:
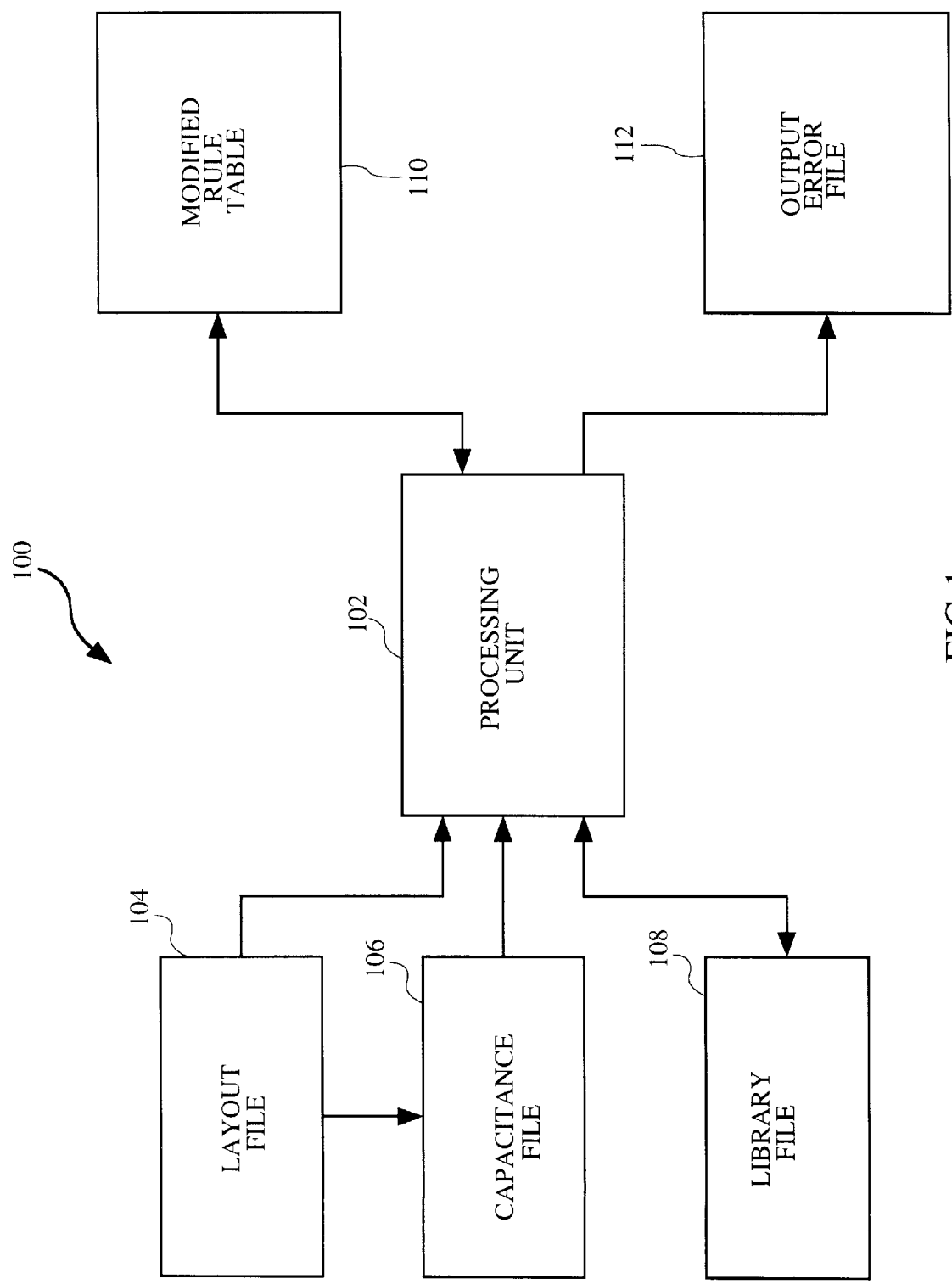
FIG. 1 is a block diagram of an electromigration check system according to an embodiment of the invention.

FIG. 1 is a block diagram of an electromigration check system 100 according to an embodiment of the invention. The electromigration check system 100 includes a processing unit 102 that performs the operations associated with checking an integrated circuit design to determine whether or not it is in full compliance with established process rules for a fabrication process. The design of the integrated circuit is contained in a layout file 104. The integrated circuit design includes various modules and each module includes functional cells and nets. A net includes wires and contacts which interconnect the functional cells for the integrated circuit design. The capacitance values for components (i.e., wires and contacts) of the integrated circuit design are held in a capacitance file 106. A library file 108 stores information on the functional cells. Specifically, the functional cells have a drive strength parameter associated therewith which is stored in the library file 108. The processing unit 102 is coupled to the layout file 104, the capacitance file 106, and the library file 108 to receive the information available from these files. The processing unit 102 is also coupled to a rules table 110. The rules table 110 contains the process rules for the fabrication process.

Given all the information provided to the processing unit 102, the processing unit 102 of the electromigration check system 100 then operates to identify those wires or contacts within each of the nets of the integrated circuit design that violate the process rules contained in the rules table 110. These violations can then be stored to an output error file 112 for later use by interested parties. The processing unit 102 and its operations are discussed in additional detail below with respect to FIGS. 4 and 5A–5C.

The rules table 110 can take many different forms. In one embodiment, the rules table 110 has a structure that relates drive strength and capacitance to a minimal wire or contact size or dimensions. Table 1 provided is an exemplary structure for the rules table 110.

TABLE 1

| Drive | MET1 | MET2 | Via1 | Via2 | Contact |
|---|---|---|---|---|---|
| 32 | — | — | >=2pf<br>2 via | >=2pf<br>2 via | >0.5pf<br>2 Ct |
| 48<br><1um | >=3pf<br>>=0.81 | — | >=1pf<br>2 via | >=1pf<br>2 via | >=0.5pf<br>2 Ct |
| 48<br>>1um | 1.5pf 1.03<br>2.0pf 1.09<br>2.5pf 1.13<br>3.0pf 1.16 | — | >=1pf<br>2 via | >=1pf<br>2 via | >=0.5pf<br>2 Ct |

Note that, in the rules table 110 illustrated in Table 1, drive strength is in the left most column under the heading "Drive", and in the remaining columns capacitance values and minimal dimensions are provided for various conductive portions of a network. The column under the heading "MET1", includes capacitance values above which the wires in layer MET1 are required to have at least the stated minimal width to avoid electromigration problems for the given process to which the process rules in Table 1 pertain. The depth of the wires is typically predetermined by the fabrication process. Namely, with a drive strength of 48 times the minimum drive strength of a minimum size driver (transistor) and a wire width greater than 1 um and a capacitance of 2 pf, the minimal wire width is at least 1.08 um. The column under the heading "Via1" includes a capacitance above which two (2) vias are required to have to avoid electromigration problems for the given process to which the process rules in Table 1 pertain. For example, with a drive strength of 48 times the minimum drive strength of a minimum size driver (transistor) and a wire width greater than 1 um and a capacitance of at least 1 pf, the minimal width of the via is two (2) vias (referred to as a double via). In other words, the cross-sectional width of the via is twice that of a single via. Hence, a double via (i.e., two vias) contains more conductive material than would a single via and therefore can carry more current before being susceptible to electromigration problems. Although Table 1 measures the minimal widths of vias in integer multiples of a single standard via width for the given process, it is not necessary the widths of the vias be limited to integer multiples (though doing so may facilitate fabrication). For example, the rules table 110 illustrated in Table 1 could instead indicate that the minimal width for a via is 1.2 times the single standard via width. Alternatively, the rules table 110 illustrated in Table 1 could specify a specific cross-sectional width in microns. For purposes of this application, it should be noted that vias are considered to be one particular type of contact.

Figure 2:
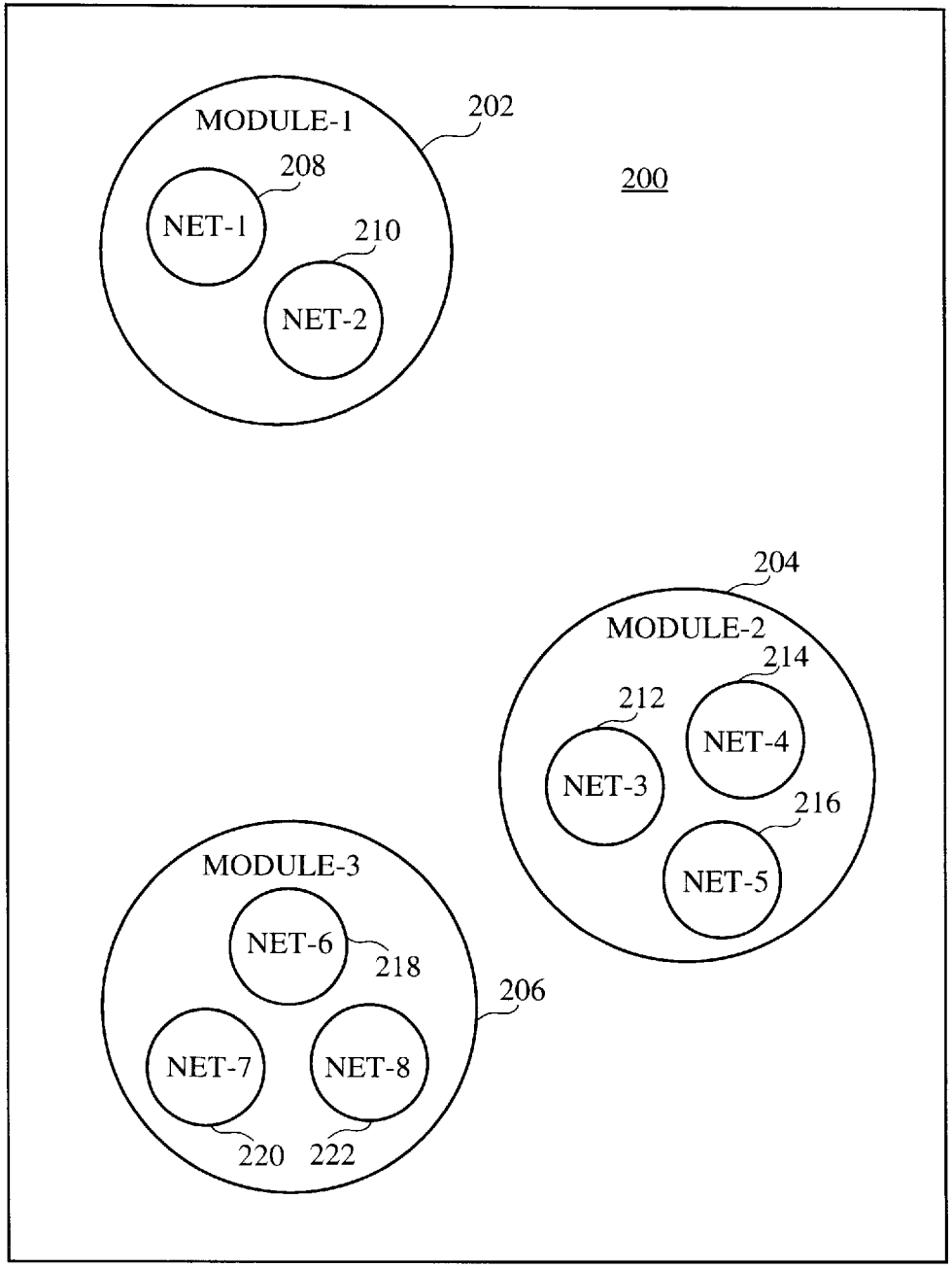
FIG. 2 is a conceptual diagram illustrating a representative integrated circuit design.

FIG. 2 is a conceptual diagram illustrating a representative integrated circuit design 200. The representative integrated circuit design 200 is made up of several modules, namely module-1 202, module-2 204 and module-3 206. Within each of the modules 202, 204 and 206, various nets are provided. In particular, the module-1 202 includes net-1 208 and net-2 210. Similarly, the module-2 204 includes net-3 212, net-4 214 and net-5 216. The module-3 206 includes net-6 218, net-7 220 and net-8 222. Each of the nets 208–222 is a collection of contacts and wires which interconnect various functional cells.

Figure 3A:
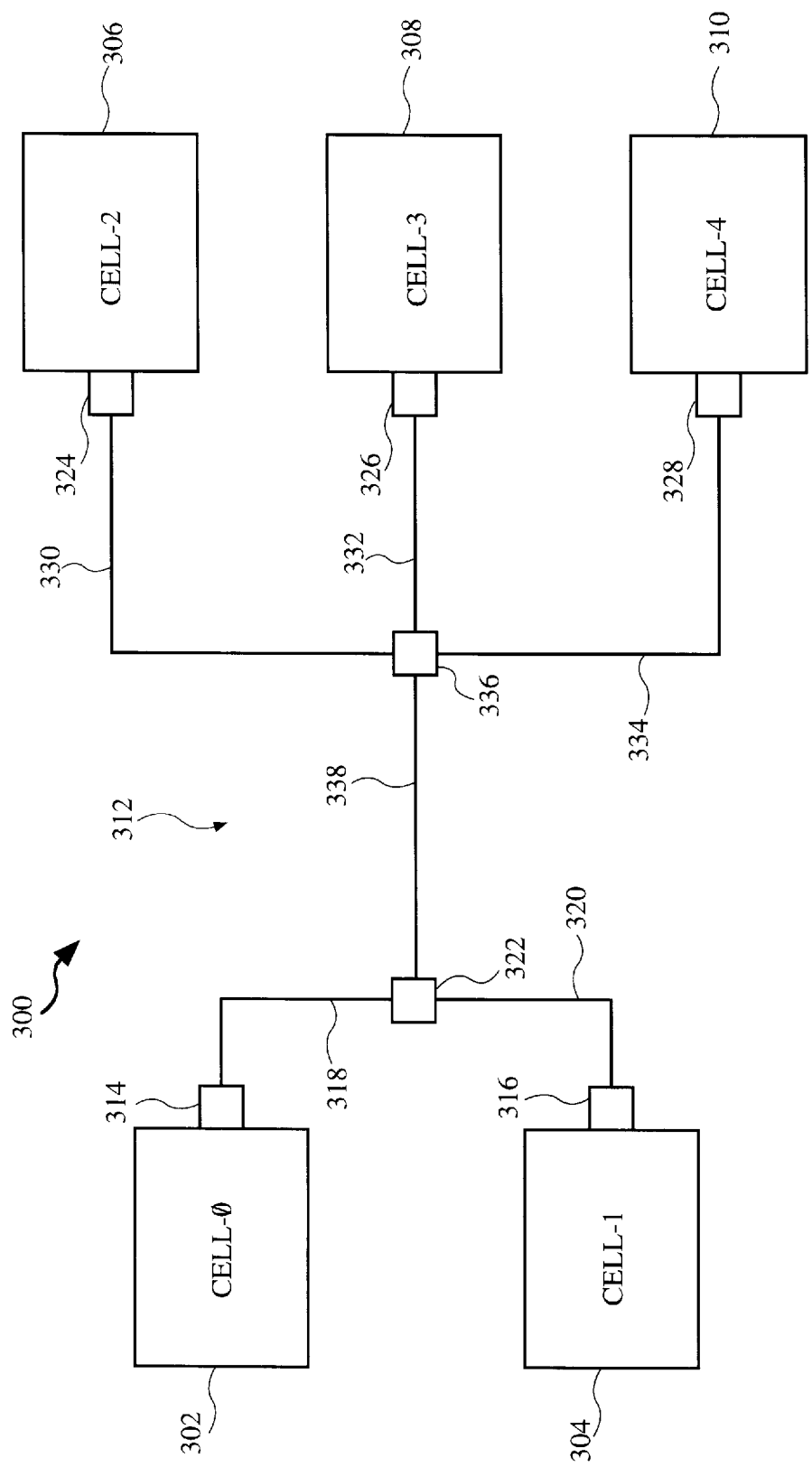
FIG. 3A is a schematic diagram of a representative net.

FIG. 3A is a schematic diagram of a representative net 300. The representative net 300 includes several functional cells. The functional cells in the representative net 300 include cell-0 302, cell-1 304, cell-2 306, cell-3 308 and cell-4 310. These functional cells 302–310 are interconnected by a net 312. The net 312 is formed by various wires and contacts. The wires are also known as lines, and the contacts represent pads as well as vias.

The net 312 includes contacts 314 and 316. The contacts 314 and 316 are also output nodes or driving nodes as they are coupled to the cell-0 302 and the cell-1 304, respectively, which output or drive current into the remaining portion of the net 312. The contact 314 is connected to a wire 318, and the contact 316 is connected to a wire 320. The wire 318 and the wire 320 are then connected at a contact 322. The net 312 also includes contacts 324, 326 and 328. The contacts 324, 326 and 328 are input nodes as they receive current from the remaining portion of the net 312. The contact 324 is connected to a wire 330, the contact 326 is connected to a wire 332, and a contact 328 is connected to a wire 334. The wires 330, 332 and 334 are connected together at a contact 336.

The contact 336 is also connected to the contact 322 by a wire 338. The contact 336 can also be considered an internal node of the net 312. The wires of the net 312 have defined dimensions (thickness and width) and the contacts have a defined size. Typically, with integrated circuit designs, the wires (also known as conductive traces or lines) can traverse and interconnect with different layers, such as a metal-1 layer, a metal-2 layer and a metal-3 layer. The contacts can be pads on a given layer with a size of a multiple of contacts, or vias which traverse the various layers to interconnect the wires and have a size of a multiple of vias. For example, a single contact or a double contact could be used, with the double contact capable of safely carrying more current. Likewise, a single via or a double via could be used with the double via capable of safely carrying more current.

Figure 3B:
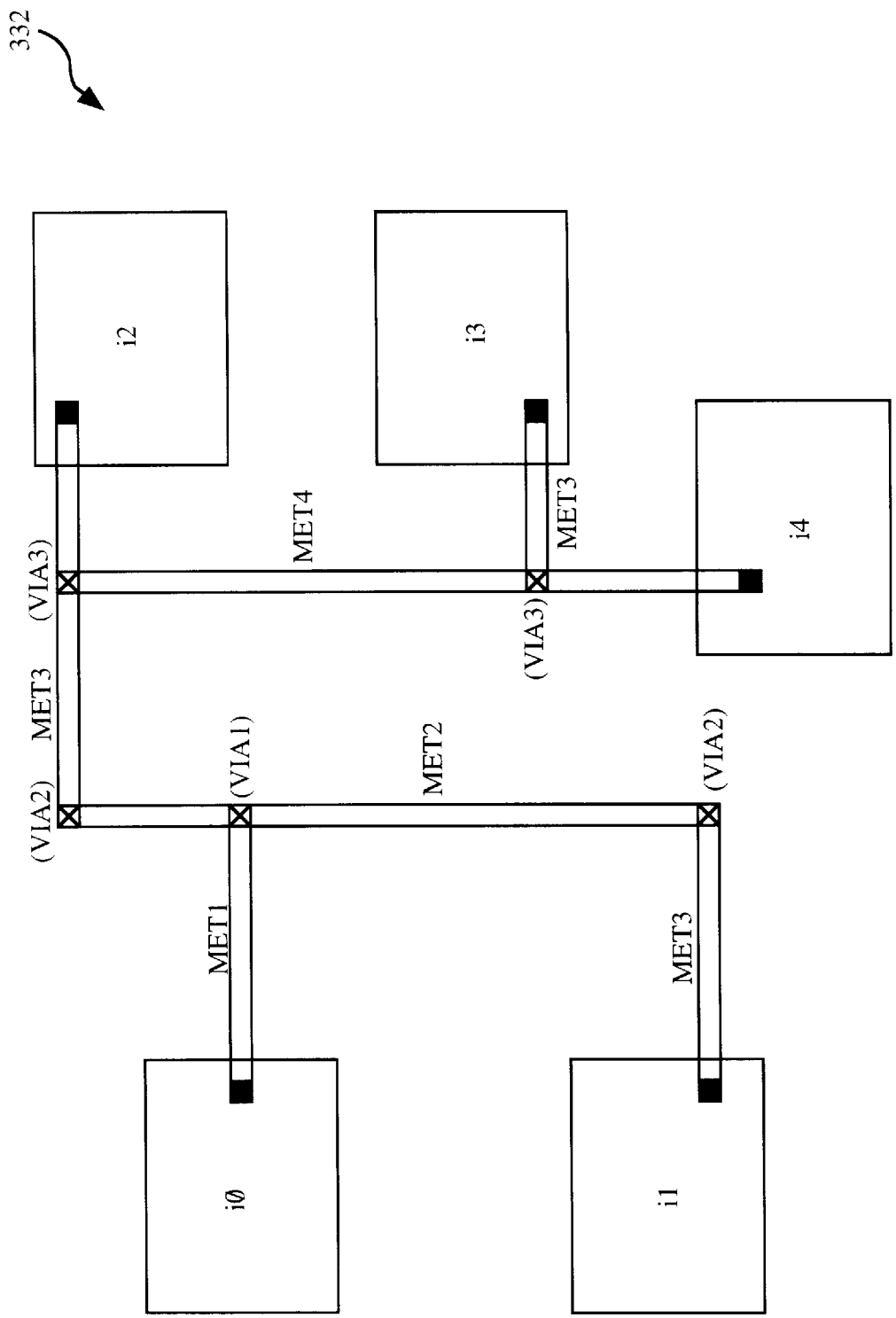
FIG. 3B is a schematic diagram of a representative layout file.

FIG. 3B is a schematic diagram of a representative layout file 332. The layout file 332 is a conceptual view of the representative layout file 332 for the representative net 300 illustrated in FIG. 3A. The layout file 332 includes cells (i0–i4), metal layers (MET1, MET2, MET3 and MET4), and vias (VIA1, VIA2 and VIA3). In practice, the layout file 332 is an electronic file that describes the elements and interconnections for the representative net 300 using a predetermined set of rules. Layout software tools produce layout files and are readily available from several commercial sources. One commercial source for such layout software tools is Mentor Graphics, Inc. of Wilsonville, Oreg.

Figure 4:
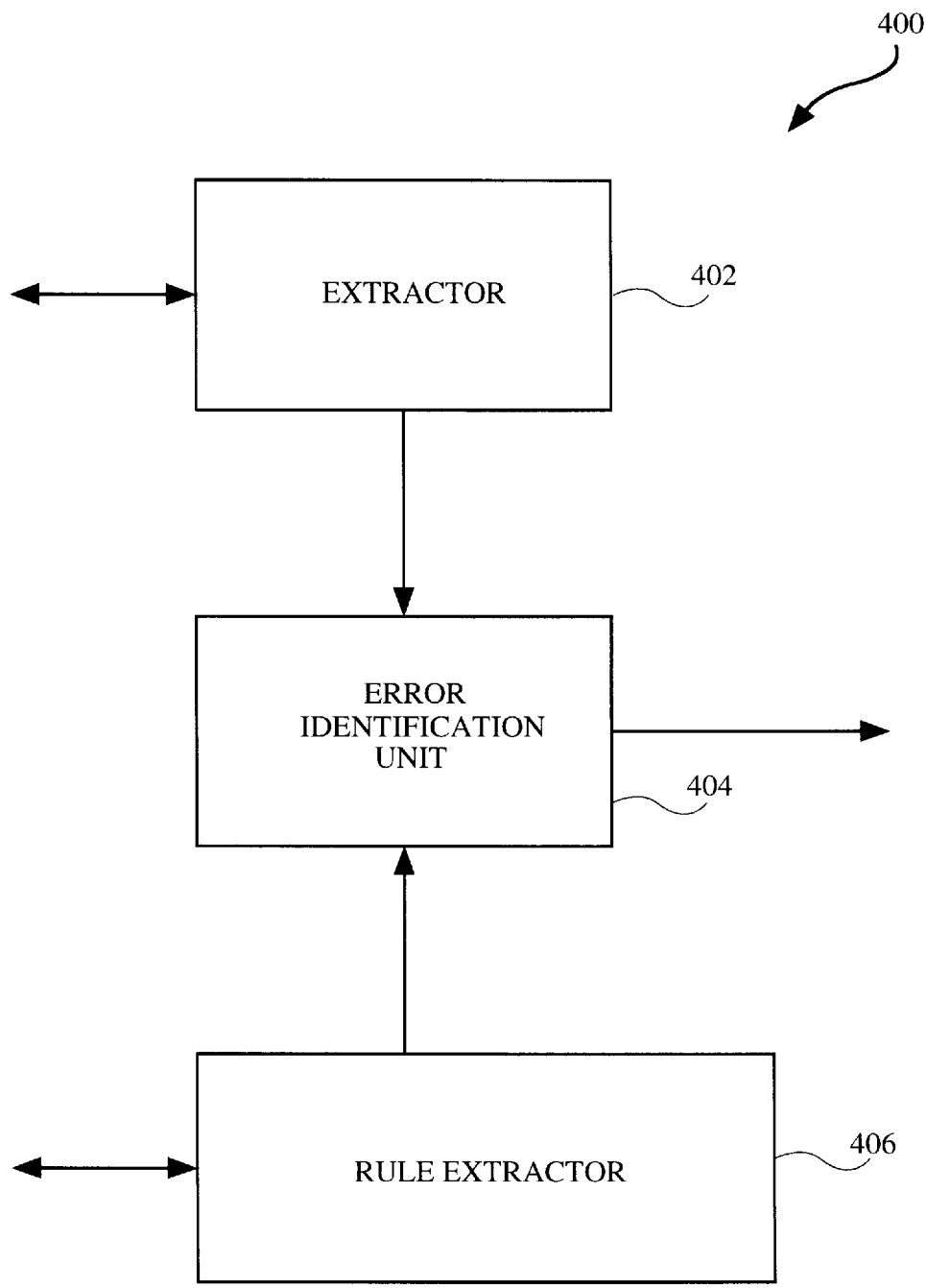
FIG. 4 is a diagram of a processing unit according to an embodiment of the invention.

FIG. 4 is a diagram of a processing unit 400 according to an embodiment of the invention. The processing unit 400 is a detailed diagram of an exemplary implementation of the processing unit 102 illustrated in FIG. 1. The processing unit 400 includes an extractor 402 for extracting the needed input information from the layout file 104, the capacitance file 106, and the library file 108. The processing unit 400 also includes a rule extractor 406. The rule extractor 406 operates to extract the appropriate process rules from the rules table 110. The processing unit 400 further includes an error identification unit 404. The extracted input information is forwarded by the extractor 402 to the error identification unit 404. The appropriate process rules information obtained by the rule extractor 406 is also forwarded to the error identification unit 404. The error identification unit 404 then identifies whether there are any violations or errors of the process rules by the integrated circuit design. The processing performed by the error identification unit 404 is described in more detail below with respect to FIGS. 5A–5C.

Figure 5A:
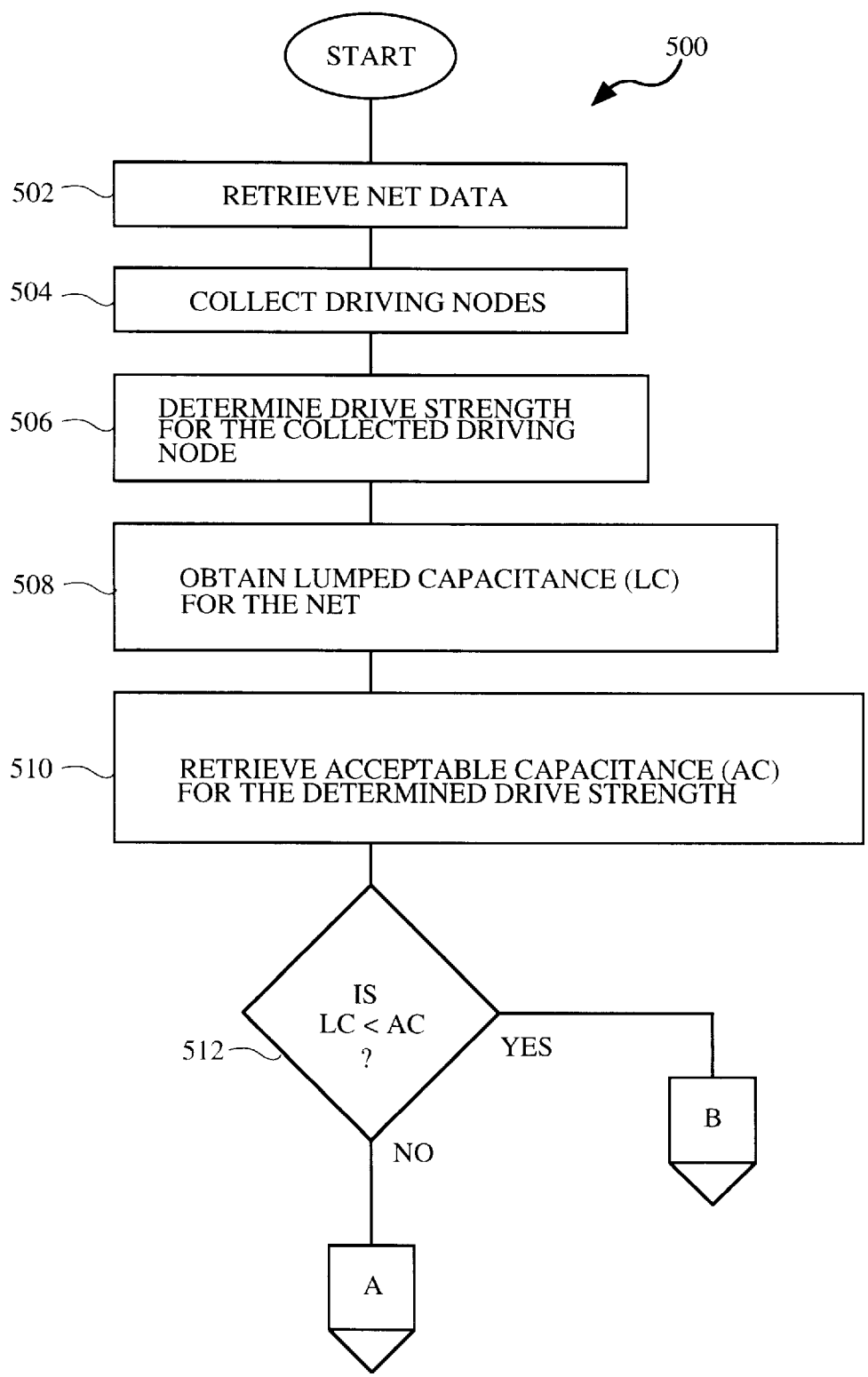
FIGS. 5A–5C are flow diagrams illustrating error identification processing performed according to an embodiment of the invention.
Figure 5B:
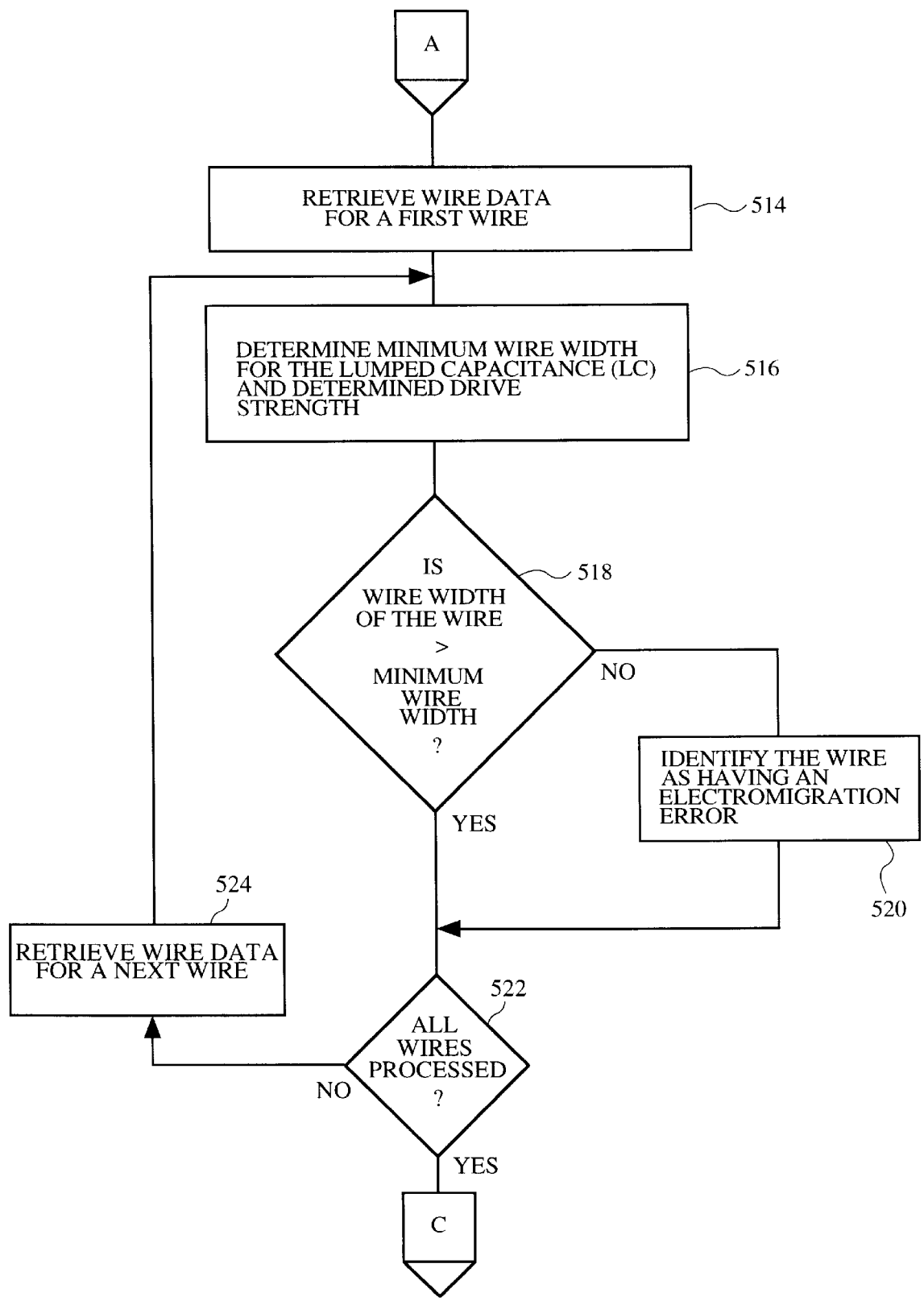
Figure 5C:
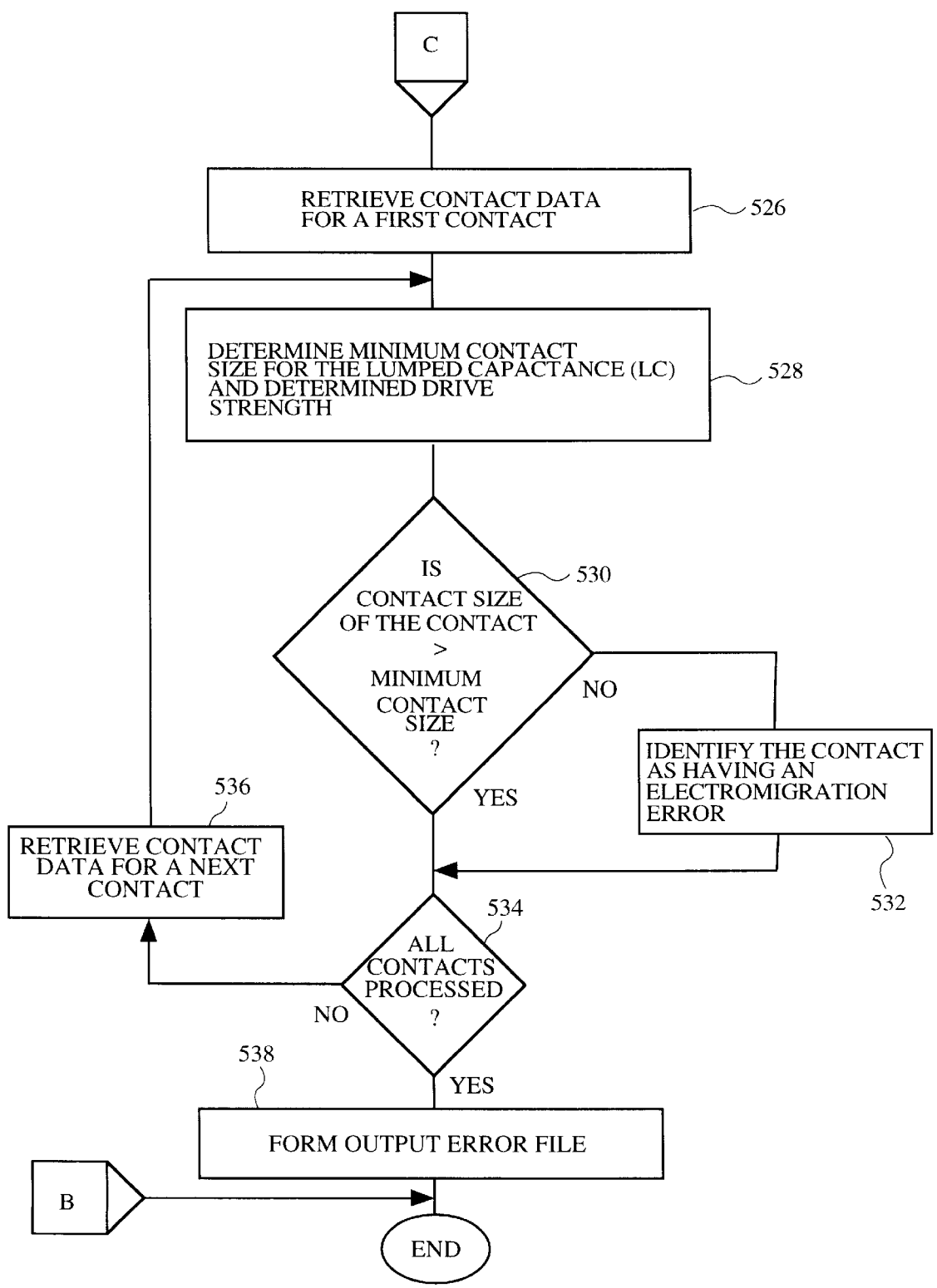

FIGS. 5A–5C are flow diagrams illustrating error identification processing 500 performed according to an embodiment of the invention. The error identification processing 500 identifies violations of process rules for fabrication of an integrated circuit design. In one embodiment, the error identification processing 500 is performed by the processing unit 400.

The error identification processing 500 initially retrieves 502 net data. For example, with respect to FIG. 4, the extractor 402 operates to retrieve the net data from the layout file 104. The net data is data pertaining to the layout of a particular network. As an example, the network could be any one of the nets 208–222 (see FIG. 2). Then, using the net data, driving nodes within the net data are identified and collected 504. The driving nodes within the net data operate to drive the net. In one embodiment, the driving nodes are identified by contacts (e.g., pads) that are identified as having a particular output type. Typically, the contacts with the output type connect functional cells to the net at so called driving nodes. Hence, the identification of the contacts of the output type identifies the driving nodes.

Then, once the driving nodes for the net are identified, the driving nodes are collected 504 by collapsing the driving nodes into a single driving node. The drive strength for the collected driving node is determined 506. The drive strength can be determined 506 using the drive strengths for the functional cells coupled to the driving nodes that are contained within the library file 108. That is, the library file 108 contains properties of functional cells, and one of these properties is the drive strength for the functional cell. The drive strength for the functional cells connected to the driving nodes can then be summed to determine 506 the drive strength for the collected driving node.

Next, a lumped capacitance (LC) for the net is obtained 508. The lumped capacitance (LC) for the net can be obtained from the capacitance file 106. In one embodiment, the capacitance file 106 contains the capacitance value for the net as a whole. In particular, using conventional techniques, the integrated circuit design contained in a layout file 104 is evaluated to determine a capacitance value for each net of the integrated circuit design. This determined capacitance value for the net is referred to as the lumped capacitance (LC) for the net. In effect, determining of the lumped capacitance (LC) for each of the nets involves collapsing the net into what is conceptually a single wire. Commercially available software, such as Checkmate by Mentor Graphics, Inc. of Wilsonville, Oreg., is able to determine the lumped capacitance (LC) for the net. Such commercially available software is primarily designed and used for determining capacitance on clock lines, but can also be used to determining capacitance on signal lines.

An acceptable capacitance (AC) for the determined drive strength is retrieved 510 from the rules table 110. Here, the appropriate process rule within the rules table 110 is retrieved 510 to identify the acceptable capacitance (AC) in accordance with the existing drive strength. The acceptable capacitance (AC) is the maximum capacitance that the net can have for the predetermined wire and contact dimensions to be sufficient to avoid violation of the process rules pertaining to electromigration. Table 1, discussed above, provides examples of such process rules. For example, for a drive strength of 32 or less, a capacitance of less than 2 pf is an acceptable capacitance (AC) for one via (either Via1 or Via2) or a capacitance of less than 0.5 pf is an acceptable capacitance (AC) for one contact. After obtaining 508 the lumped capacitance (LC) and retrieving 510 the acceptable capacitance (AC), a decision 512 determines whether the lumped capacitance (LC) is less than the acceptable capacitance (AC). If so, the error identification processing 500 is complete and ends because, in this case, the lumped capacitance (LC) for the net is not great enough to cause electromigration violations given the minimum wire and contact size for the fabrication process. On the other hand, when the lumped capacitance (LC) for the net is not less than the acceptable capacitance (AC), then the error identification processing 500 continues.

Next, each of the wires within the net are checked for electromigration violations. Initially, wire data for a first wire is retrieved 514. Preferably, the wire data is retrieved 514 from the layout file 104. For all the wires of the integrated circuit design, the thickness is assumed to be a predetermined thickness, and the width of the wires varies but is indicated in the wire data. A minimum wire width for the lumped capacitance (LC) and the determined drive strength is then determined 516. In one embodiment, the lumped capacitance (LC) and the determined drive strength are used to index into the rules table 110 to obtain the minimum wire width. Table 1, discussed above, is one example of the rules table 110. After determining 516 the minimum wire width, a decision 518 determines whether the wire width of the wire according to the integrated circuit design is greater than the minimum wire width. If so, the wire is identified 520 as having an electromigration error. Otherwise, the identifying operation 520 is bypassed because the wire width is sufficient to satisfy the process rules concerning electromigration given the lumped capacitance (LC) and the determined drive strength. Following either the decision block 518 or the identifying block 520, a decision 522 determines whether all of the wires for the net have been processed. If not, the wire data for a next wire is retrieved 524 and the processing 500 returns to repeat block 516 and subsequent blocks. Once all of the wires have been processed, the decision block 522 causes the processing 500 to proceed to check the contacts within the integrated circuit design for electromigration violations.

Each of the contacts within the net are then checked for electromigration violations. Initially, contact data for a first contact is retrieved 526. In one embodiment, the contact data is contained within the layout file 104, and the contact data indicates a size of a contact as a multiple of a regular contact because this is how the contacts are formed. Namely, a double contact is formed from two regular (or single) contacts, one placed over the other. The double contact is capable of carrying more current safely than can a single contact. Recall, the term contacts includes pads and vias. Next, a minimum contact size for the lumped capacitance (LC) and the determined drive strength is determined 528. Here, the lumped capacitance (LC) and the determined drive strength are used to index into the rules table 110 to obtain the minimum contact size. A decision 530 then determines whether the contact size of the contact is greater than the minimum contact size. If not, the contact is identified 532 as having an electromigration error. For example, the contact size of the contact is one (1) regular contact and the minimum contact size is two (2) regular contacts (i.e., a double contact), then there is a violation of the process rules pertaining to electromigration. On the other hand, if the contact size of the contact is greater than or equal to the minimum contact size, then the contact does not have an electromigration error.

Following the decision block 530 or the identifying block 532, a decision 534 determines whether all of the contacts within the net have been processed. If all of the contacts in the net have not been processed, the decision block 534 causes the contact data for a next contact to be retrieved 536 and the processing 500 returns to repeat block 528 and subsequent blocks. Once all the contacts have been processed, an output error file is formed 538. The format of the output error file can vary greatly but is designed either for a user or as input to an integrated circuit layout tool which would allow the user to visually perceive the wires and contacts where violations occurred and/or automate the modifications to the integrated circuit design to avoid the electromigration errors which have been identified by the processing 500. Following block 538, the error identification processing 500 is complete and ends.

Representative file formats for the capacitance file 106, the library file 108 and the output error file 112 are presented below.

```
--------------------------------------------------
           Representative Capacities File
--------------------------------------------------
** This file describes the capacitance values of different
** nets in a particular exemplary layout. Emphasis is given
** to certain data by "^^^^" marks. Of particular interest is the
** capacitance values of net #270 and #880. The capacitance units are
** femto farads.
**
iCELL sf_imu {
   INOUT zzz_asi_data1 [63];
   INOUT zzz_asi_data1 [62];
   INOUT zzz_asi_data1 [61];
   INOUT zzz_asi_data1 [60];
   OUT imu_tlb_pa [14];
   OUT imu_tlb_pa [13];
   IN dmu_pcontext [12];
   IN dmu_pcontext [11];
   [. . . . stuff deleted . . . .]
   INST sf_imudp imudp en_tri_pdu_36to8=sf_imu_I7_P4
rst_tri_en=sf_imu_I4_P2
       st_pdu_va_context_d2=sf_imu_I513_P4 tlb_data_ld_n1=sf_imu_I504_P6
                                     +e,cir +ee
                                  [ For Path # 880 ]
   INST sf_imuctl imuctl ieu_va_e[1]=ieu_va_e_ctl[4]_P2
imu_busy=imu_busy_P2
       spr_io_obs_bus_r1 [5]=spr_io_obs_bus_r1[5]_P2
       +e,cir +ee
          [ For Path #270 ]
   [. . . . stuff deleted . . . .]
   C C7_23_M2_TOTAL_1 c=0.9985 s=sf_imu_I7_P3 d=gnd;
   C C7_23_M2_TOTAL_2 c=0.9985 s=sf_imu_I7_P4 d=gnd;
   C C7_24_M2_TOTAL_1 c=0.953 s=sf_imu_I7_P1 d=gnd;
   C C7_24_M2_TOTAL_2 c=0.953 s=sf_imu_I7_P2 d=gnd;
   C C7_25_M3_TOTAL_1 c=0.775 s=sf_imu_I7_P5 d=gnd;
   C C7_25_M3_TOTAL_2 c=0.775 s=sf_imu_I7_P6 d=gnd;
   C C8_28_M2_TOTAL_1 c=0.683 s=sf_imu_I8_P1 d=gnd;
   C C8_28_M2_TOTAL_2 c=0.683 s=sf_imu_I8_P2 d=gnd;
   C C8_29_M2_TOTAL_1 c=1.13 s=sf_imu_I8_P3 d=gnd;
   C C8_29_M2_TOTAL_2 c=1.13 s=sf_imu_I8_P4 d=gnd;
   C C8_30_M3_TOTAL_1 c=12.6 s=sf_imu_I8_P5 d=gnd;
   C C8_30_M3_TOTAL_2 c=12.6 s=sf_imu_I8_P6 d=gnd;
   C Cdmu_pcontext[3]_33_M2_TOTAL_1 c=1.153 s=dmu_pcontext[3] d=gnd;
   C Cdmu_pcontext[3]_33_M2_TOTAL_2 c=1.153 s=dmu_pcontext[3]_P2
d=gnd;
   [. . . . stuff deleted . . . .]
   C CLumped504 C=45.509 s=sf_imu_I504_P6 d=gnd;
                                  +e,cir +ee
                               [ For Path # 880 ]
   C Clumped2985 C=201.846 s=spr_io_obs_bus_r1[5]_P2 d=gnd;
                                  +e,cir +ee
                               [ For Path #270]
}
--------------------------------------------------
           Representative Library File
--------------------------------------------------
** This file describes attributes of cells that are used
** in a particular exemplary layout. The K_rise and the
** K_fall represent the pull-up and pull-down resistance
** (i.e., drive strength) for each cell. This is the
** information we need for this file.
**
}
sf_x_buf_16x {
         attributes {
              cell_name sf_x_buf_16x
         }
         properties {
         }
         bbox {
         }
         translation {
              Autologic {
                   cost 546
              }
         }
         model {
              cellname sf_x_buf_16x
              pins {
                   out {
```

```
                    type out
                        K_rise 0.2375
                        K_fall 0.222879
                }
                in {
                        type in
                        load 0.0483
                }
                out_1 {
                        type out
                        K_rise 0.502232
                        K_fall 0.458147
                }
            }
            equations {
                    out = in
                    out_1 = ( ! in )
            }
            transport_delay {
                    in out_1 0.157 0.1246
                    in out 0.166767 0.197233
            }
            timing_constraints {
            }
        }
    }
}
sf_x_mux2b_32x {
        attributes {
                cell_name sf_x_mux2b_32x
        }
        properties {
        }
        bbox {
        }
        translation {
                Autologic {
                        cost 1001
                }
        }
        model {
                cellname sf_x_mux2b_32x
                pins {
                        out {
                                type out
                                K_rise 0.155208
                                K_fall 0.0897745
                        }
                        in1 {
                                type in
                                load 0.0772
                        }
                        in0 {
                                type in
                                load 0.0746
                        }
                        sel0 {
                                type in
                                load 0.0227
                        }
                }
                equations {
                        out = ( ( sel0 && in0 ) || ( ( ! sel0 ) && in1 ) )
                }
                transport_delay {
                        sel0 out 0.4377 0.468729
                        in0 out 0.270195 0.319514
                        in1 out 0.254459 0.3315
                }
                timing_constraints {
                }
        }
}
        { STUFF DELETED }
```

---
Representative Error File
---

** This file describes a represented error file produced
** by the invention. Two violations are shown [#880, #270].
** The drive strength, lumped capacitance (LC), width, layer
** information of each conductive trace in the net are shown -continued

** for each net that violates the predetermined process rules.
** The unit for LC are pico farads.
**
880: imudp_imu_dpr_$_{dpr}$_tlb_data_ld_n1, 12 paths
    total len. = 977.51
      Lumped Cap = 0.0455
        Drive      = 45
      path # 0:
           head = imudp_imu_dpr_route_5_N119[974]
           tail = imudp_imu_dpr_dpr_tlb_data_ld_n1
           len. = 259.0000
           wid. = 0.5600
           lev. = MET2
      path # 1:
           head = imudp_imu_dpr_ram_size_mux_mux_1.se10
           tail = imudp_imu_dpr_route_5_N119[977]
           len. = 2.3100
           wid. = 0.4200
           lev. = POLY1
      path # 2:
           head = imudp_imu_dpr_route_5_N119[976]
           tail = imudp_imu_dpr_route_5_N119[977]
           len. = 19.6000
           wid. = 0.5600
           lev. = MET1
      path # 3:
           head = imudp_imu_dpr_ram_size_mux_mux_0.se10
           tail = imudp_imu_dpr_route_5_N119[976]
           len. = 2.3100
           wid. = 0.4200
           lev. = POLY1
      path # 4:
           head = imudp_imu_dpr_route_5_N119[975]
           tail = imudp_imu_dpr_route_5_N119[976]
           len. = 512.7500
           wid. = 0.5600
           lev. = MET1
      path # 5:
           head = imudp_imu_dpr_route_5_N119[975]
           tail = imudp_imu_dpr_route_5_N119[974]
           len. = 3.6750
           wid. = 0.5600
           lev. = MET3
      path # 6:
           head = imudp_imu_buf1_route_0_N30[270]
           tail = imudp_imu_buf1_dpr_tlb_data_ld_n1
           len. = 5.3900
           wid. = 0.7000
           lev. = MET2
      path # 7:
           head = imudp_imu_buf1_route_1_N55[456]
           tail = imudp_imu_buf1_route_0_N30[271]
           len. = 61.4600
           wid. = 0.7000
           lev. = MET2
      path # 8:
           head = imudp_imu_buf1_route_0_N30[271]
           tail = imudp_imu_buf1_route_0_N30[270]
           len. = 31.7800
           wid. = 0.7000
           lev. = MET1
      path # 9:
           head = imudp_imu_buf1_route_1_N55[456]
           tail = imudp_imu_buf1_route_1_N55[455]
           len. = 52.0800
           wid. = 0.7000
           lev. = MET3
      path # 10:
           head = imudp_imu_buf1_tlb_data_ld_n1_buf_i_1.selo
           tail = imudp_imu_buf1_route_1_N55[455]
           len. = 27.1600
           wid. = 0.7000
           lev. = MET2
      path # 11:
           head = imudp_imu_dpr_dpr_tlb_data_ld_n1
           tail = imudp_imu_buf1_dpr_tlb_data_ld_n1
           len. = 0.0000
           wid. = 0.5600
           lev. = MET2
270:   spr_io_obs_bus_r1[5], 7 paths

```
    total len. = 734.23
      Lumped Cap = 0.2018
      Drive      = 40
    path # 0:
        head = imcut1_c14b00a9
        tail = imuct1_c130008e
        len. = 133.9800
        wid. = 0.5600
        lev. = MET2
```

As discussed above, the error identification processing of the invention uses the lumped capacitance (LC) and the determined drive strength to determine the minimum dimensions for the entire net when checking individual wires and contacts of an integrated circuit design for electromigration errors. However, the results produced by the invention are accurate. In fact, with this approach, the values for the lumped capacitance (LC) and the determined drive strength are in fact conservative estimates so that the processing does not to miss any errors. Nevertheless, it should be recognized that in other embodiments individual values for the lumped capacitance (LC) and the drive strength can be determined and utilized within the error identification processing 400 for possibly greater accuracy.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A computer implemented method for detecting electromigration violations in an integrated circuit design, the integrated circuit design having driving nodes and one or more networks, the driving nodes being coupled to the one or more networks, and each of the networks including conductive traces, said method comprising the operations of:

(a) providing electromigration process rules for conductive signal traces of the integrated circuit design;

(b) identifying the driving nodes for a network within the integrated circuit design;

(c) collapsing the identified driving nodes for the network into a collected driving node;

(d) determining a drive strength for the collected driving node using predetermined drive strengths for functional cells coupled to the collected driving node;

(e) determining a capacitance for the network coupled to the identified driving nodes;

(f) determining design dimensions of conductive signal traces within the network of the integrated circuit design;

(g) determining minimum dimensions for the conductive signal traces of the integrated circuit design based on the determined capacitance, the determined drive strength and the electromigration process rules;

(h) comparing the determined design dimensions with the minimum dimensions; and (i) identifying violations of the fabrication process rules for the conductive signal traces of the integrated circuit design when said comparing (h) indicates that the determined design dimensions are less than the minimum dimensions.

2. A method as recited in claim 1,
   wherein the predetermined drive strengths for the functional cells coupled to the collected driving node are stored in a library file, and
   wherein said method further comprises:
   (j) forming an output error file that includes information concerning the violations identified.

3. A method as recited in claim 1,
   wherein the predetermined drive strengths are related to a minimum driver size, and
   wherein said determining (e) of the capacitance for the network operates to determine a lumped capacitance associated with the network.

4. A method as recited in claim 3, wherein the network comprises a plurality of interconnected links, and
   wherein said determining (e) of the lumped capacitance for the network coupled to the identified driving nodes comprises:
   identifying capacitances for each of the links of the network; and
   combining the capacitances for each of the links of the network to determine the lumped capacitance for the network.

5. A method as recited in claim 4, wherein the determined dimensions of the conductive signal traces are widths.

6. A method as recited in claim 5, wherein the determined dimensions of the conductive traces are provided in a layout file, and the fabrication process rules are provided in a process rules table.

7. A computer-implemented method for checking an integrated circuit design for violations of fabrication process rules, said method comprising:

(a) partitioning the integrated circuit design into nets that couple functional cells together, each net having wires and contacts;

(b) determining a drive strength that drives each of the nets using predetermined drive strengths for functional cells coupled to the nets;

(c) determining a capacitance for each of the nets;

(d) comparing the capacitance with a predetermined acceptable capacitance to produce a comparison result for each of the nets, the acceptable capacitance being determined based on the determined drive strength;

(e) bypassing subsequent operations (f) and (g) for one or more of the nets based on the comparison results for each of the nets;

(f) determining a minimum wire width for each of the nets based on the determined capacitance and the determined drive strength; and (g) identifying violations of the fabrication process rules when the width of the wires within the nets are less than the minimum wire width for the respective nets.

8. A method as recited in claim 7,
   wherein the predetermined drive strengths are related to a minimum driver size, and wherein said method further comprises: (h) forming an output error file that includes information concerning the violations identified.

9. A method as recited in claim 7, wherein said determining (f) comprises determining a minimum contact size for each of the nets based on the determined capacitance and the determined drive strength, and wherein said identifying (g) comprises identifying violations of the fabrication process rules when the size of the contacts within the nets are less than the minimum contact size for the respective net.

10. A method as recited in claim 9, wherein the predetermined drive strengths for the functional cells coupled to the nets are stored in a library file, and wherein said method further comprises: (h) forming an output error file that includes information concerning the violations identified.

11. A computer-implemented method for checking an integrated circuit design for violations of fabrication process rules, said method comprising:

(a) partitioning the integrated circuit design into nets that couple functional cells together, each net having wires and contacts;

(b) determining a drive strength for each of the nets using predetermined drive strengths for the functional cells coupled to each of the nets;

(c) determining a capacitance for a plurality of wires and contacts within each of the nets;

(d) comparing the capacitance with a predetermined acceptable capacitance to produce a comparison result for each of the nets;

(e) bypassing subsequent operations (f) and (g) for one or more of the nets based on the comparison results for each of the nets;

(f) determining minimum dimensions for the wires and contacts within each of the nets based on the determined drive strength and the determined capacitances for the wires and contacts; and (g) automatically identifying violations of the fabrication process rules when the dimensions of the wires and contacts within the net are respectively less than the minimum dimensions for the wires and contacts.

12. A method as recited in claim 11, wherein said method further comprises:

(h) forming an output error file that includes information concerning the location of the violations within the integrated circuit design.

13. An electromigration check system for automated identification of electromigration errors in an integrated circuit design, the integrated circuit design including at least one network and at least one functional cell, said electromigration check system comprising:

a layout file containing layout information for the integrated circuit design;

a capacitance file for storing one or more capacitance values for the at least one network or a portion thereof within the integrated circuit design;

a library file for storing functional cells and parameters for the functional cells, one of the parameters being predetermined drive strengths for the functional cells;

a rules table containing process rules for fabrication of integrated circuits; and a processing unit, operatively connected to said layout file, said capacitance file, said library file and said rules table, for identifying electromigration errors in the integrated circuit design, said processing unit being able to rapidly identify electromigration errors in the integrated circuit design by avoiding time consuming individualized checking of conductive elements in the integrated circuit design.

14. An electromigration check system as recited in claim 13, wherein said electromigration check system further comprises:

an output error file produced by said processing unit to contain information on the electromigration errors.

15. An electromigration check system as recited in claim 13, wherein the at least one network includes at least one of wires and contacts, and wherein the electromigration errors pertain to the wires or the contacts within the at least one network of the integrated circuit design.

16. An electromigration check system as recited in claim 15, wherein said processing unit comprises:

means for determining a drive strength for the at least one network based on the drive strength of the at least one functional cell;

means for determining a capacitance for the at least one network based on the one or more capacitance values stored in said capacitance file;

means for comparing the capacitance with a predetermined acceptable capacitance to produce a comparison result for the at least one network;

means for determining a minimum wire width for the wires within the at least one network based on the determined capacitance and the determined drive strength;

means for identifying violations of the process rules when the width of the wires within the net are less than the minimum wire width; and means for bypassing said means for determining the minimum wire with and said means for identifying violations for the at least one network based on the comparison results.

17. A method as recited in claim 1, wherein said method further comprises:

(j) repeating operations (b)–(i) for each of the other one or more networks within the integrated circuit design.

18. A method as recited in claim 3, wherein said method further comprises:

(j) retrieving, after said operation (d) and prior to at least said operations (h) and (i) a predetermined acceptable capacitance for the determined drive strength;

(k) comparing the lumped capacitance for the network with the predetermined acceptable capacitance; and (l) bypassing operations at least (h) and (i) when the lumped capacitance for the network is less than the predetermined acceptable capacitance.

19. A method as recited in claim 18, wherein said method further comprises:

(m) repeating operations (b)–(l) for each of the other one or more networks within the integrated circuit design.

20. A method as recited in claim 19, wherein each of the network comprise a plurality of interconnected links, and wherein said determining (e) of the lumped capacitance for the network coupled to the identified driving nodes comprises:

identifying capacitances for each of the links of the network; and combining the capacitances for each of the links of the network to determine the lumped capacitance for the network.

* * * * *